United States Patent
Unno et al.

(10) Patent No.: US 7,948,516 B2
(45) Date of Patent: May 24, 2011

(54) POSITION ACCURACY EVALUATION METHOD AND POSITION ACCURACY EVALUATION APPARATUS

(75) Inventors: Yutaka Unno, Handa (JP); Taiji Kiku, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 1470 days.

(21) Appl. No.: 11/375,812

(22) Filed: Mar. 15, 2006

(65) Prior Publication Data

US 2006/0207987 A1    Sep. 21, 2006

(30) Foreign Application Priority Data

Mar. 17, 2005  (JP) ................ 2005-077929

(51) Int. Cl.
   *H04N 7/18*    (2006.01)
   *H05B 3/68*    (2006.01)
(52) U.S. Cl. .................... 348/95; 219/443.1
(58) Field of Classification Search ............ 348/95; 219/443.1

See application file for complete search history.

(56) References Cited

U.S. PATENT DOCUMENTS

| | | |
|---|---|---|
| 2002/0179592 A1 | 12/2002 | Hiramatsu et al. |
| 2003/0047555 A1 | 3/2003 | Keum et al. |
| 2004/0104211 A1 | 6/2004 | Unno |
| 2004/0182850 A1 | 9/2004 | Wilde et al. |
| 2005/0035111 A1 | 2/2005 | Goodsel et al. |

FOREIGN PATENT DOCUMENTS

JP    2004-079440 A1    3/2004

*Primary Examiner* — Y. Lee
*Assistant Examiner* — Richard Torrente
(74) *Attorney, Agent, or Firm* — Burr & Brown (57) ABSTRACT

According to a related art for evaluating the position accuracy of heaters with respect to the plate, it is necessary to attach an energizing electrode to the heaters, and energize the heaters for a predetermined period to heat the entire plate, before measuring the temperature distribution map. Therefore, there is a problem in that several tens of minutes are required until the temperature distribution map can be measured. As the plate becomes larger, the time required for energizing the heaters to heat the entire plate becomes longer. A technique for evaluating the position accuracy of heaters with respect to the plate, without executing a process for energizing the heaters to heat the plate is disclosed.

4 Claims, 10 Drawing Sheets

| | OBJECT 10 | | | | | | | | |
|---|---|---|---|---|---|---|---|---|---|
| CALCULATE DESIGN VALUE | | STORE DESIGN VALUE | | | | | | | |
| | DESIGN VALUE | | | | DESIGN VALUE | | | DESIGN VALUE | |
| | OBJECT No. | r | θ | OBJECT No. | r | θ | OBJECT No. | r | θ |
| POINT 1 | 0 | 147.00 | 00 | POINT 18 | | | POINT 35 | | |
| POINT 2 | 1 | 123.00 | 180.00 | POINT 19 | | | POINT 36 | | |
| POINT 3 | 2 | 159.00 | 30.00 | POINT 20 | | | POINT 37 | | |
| POINT 4 | 2 | 159.00 | 70.00 | POINT 21 | | | POINT 38 | | |
| POINT 5 | 2 | 159.00 | 110.00 | POINT 22 | | | POINT 39 | | |
| POINT 6 | 2 | 159.00 | 150.00 | POINT 23 | | | POINT 40 | | |
| POINT 7 | 2 | 159.00 | 190.00 | POINT 24 | | | POINT 41 | | |
| POINT 8 | 2 | 159.00 | 230.00 | POINT 25 | | | POINT 42 | | |
| POINT 9 | 2 | 159.00 | 270.00 | POINT 26 | | | POINT 43 | | |
| POINT 10 | 2 | 159.00 | 310.00 | POINT 27 | | | POINT 44 | | |
| POINT 11 | 2 | 159.00 | 350.00 | POINT 28 | | | POINT 45 | | |
| POINT 12 | 3 | 13.76 | 35.54 | POINT 29 | | | POINT 46 | | |
| POINT 13 | 4 | 9.33 | 120.96 | POINT 30 | | | POINT 47 | | |
| POINT 14 | 5 | 9.33 | 239.04 | POINT 31 | | | POINT 48 | | |
| POINT 15 | 6 | 13.76 | 324.46 | POINT 32 | | | POINT 49 | | |
| POINT 16 | | | | POINT 33 | | | POINT 50 | | |
| POINT 17 | | | | POINT 34 | | | | | |

FIG. 7 READ MEASUREMENT RESULT

| MEASUREMENT DATE | 2001 | | | | | | | | | | | | | | | | | | |
|---|---|---|---|---|---|---|---|---|---|---|---|---|---|---|---|---|---|---|---|
| ARTICLE NAME | 300mm HEATER | | OUTER CIRCUMFERENCE | 3 | | | | | | | | | | | | | | | |

COORDINATES INFORMATION

| No. | OBJECT SHAPE | OUTER CIRCUMFERENCE / PCD MEASUREMENT | | PCD | HOLE DIAMETER | CO-ORDINATE SYSTEM | X (OR R) | Y (OR θ) | DIAMETER | X (OR R) | Y (OR θ) | DIAMETER | POSITION ERROR | DISTANCE MEASUREMENT INFORMATION | | | | |
|---|---|---|---|---|---|---|---|---|---|---|---|---|---|---|---|---|---|---|
| | | SCORE | MEASUREMENT ANGLE | | | | | | | | | | | | POINT 1 | POINT 2 | dX | dY | DISTANCE |
| 0 | θ REFERENCE POINT | | | | | RT | 147.00 | 0.00 | | 147.00 | 0.00 | | | 1 | 3 | 4 | 0.57 | -16.04 | 16.05 |
| 1 | OBJECT 1 POINT | | | | | RT | 123.00 | 180.00 | | 123.00 | 180.27 | | | 2 | 4 | 5 | -16.46 | -0.02 | 16.46 |
| 2 | OBJECT 2 POINT | 12 | 30 | | | RT | 0.00 | 0.00 | 318.00 | 0.23 | 237.83 | 316.96 | | 3 | 5 | 6 | 0.43 | 15.79 | 15.80 |
| 3 | OBJECT 3 POINT | | | | | XY | 11.20 | 8.00 | | 10.94 | 7.81 | | | 4 | 1 | 2 | 122.88 | 0.39 | 122.88 |
| 4 | OBJECT 4 POINT | | | | | XY | -4.80 | 8.00 | | 11.51 | -8.23 | | | 5 | 1 | 3 | 133.94 | 8.39 | 134.20 |
| 5 | OBJECT 5 POINT | | | | | XY | -4.80 | -8.00 | | -4.95 | -8.25 | | | 6 | 1 | 4 | 134.51 | -7.65 | 134.73 |
| 6 | OBJECT 6 POINT | | | | | XY | 11.20 | -8.00 | | -4.52 | 7.54 | | | 7 | 1 | 5 | 118.05 | -7.67 | 118.30 |
| 7 | OBJECT 7 PCD | 3 | 3 | 60 | 3 | XY | 0.00 | 0.00 | 60.00 | 0.00 | 0.00 | | 0.00 | 8 | 1 | 6 | 118.48 | 8.12 | 118.76 |
| 8 | OBJECT 8 | | | | | | | | | | | | | 9 | 1 | 7 | 123.00 | 0.58 | 123.06 |
| 9 | OBJECT 9 | | | | | | | | | | | | | 10 | | | | | |
| 10 | OBJECT 10 | | | | | | | | | | | | | | | | | | |

| | DESIGN VALUE | | | MEASUREMENT RESULT | | | | DESIGN VALUE | | | MEASUREMENT RESULT | | |
|---|---|---|---|---|---|---|---|---|---|---|---|---|---|
| | r | θ | | r | θ | | | r | θ | | r | θ | |
| POINT 1 | 147 | 0 | | 147 | 0 | | POINT 18 | 27 | 60 | | | | |
| POINT 2 | 123 | 180 | | 123 | 180.27 | | POINT 19 | 27 | 180 | | | | |
| POINT 3 | 159 | 30 | | 158.2 | 19.99 | | POINT 20 | 31.61 | 175.28 | | | | |
| POINT 4 | 159 | 70 | | 158.29 | 59.99 | | POINT 21 | 31.61 | 184.72 | | | | |
| POINT 5 | 159 | 110 | | 158.31 | 99.99 | | POINT 22 | 31.61 | 304.72 | | | | |

POSITION ACCURACY EVALUATION METHOD AND POSITION ACCURACY EVALUATION APPARATUS

CROSS REFERENCE TO RELATED APPLICATION

This application is based upon and claims the benefit of priority from a Japanese Patent Application No. TOKUGAN 2005-077929, filed on Mar. 17, 2005; the entire contents of which are incorporated herein by reference.

BACKGROUND OF THE INVENTION

1. Field of the invention

The present invention relates to a method and an apparatus for evaluating position accuracy indicating, when members made of a second material are arranged within a disk-shaped first material so as to form a first circle of the second material having a radius of a first length and a second circle of the second material having a radius of a second length, deviation amounts of the actual first circle and the second circle from designed positions.

2. Description of the Related Art

There is conventionally known, as disclosed in Japanese Patent Application Laid-Open No. 2004-079440, a technique for evaluating whether heaters made of a second material and embedded within a plate made of a first material are evenly arranged by energizing the heaters to generate heat and measuring a temperature distribution map to evaluate whether the plate is evenly heated.

SUMMARY OF THE INVENTION

However, according to the above-mentioned technique, it is necessary to attach an energizing electrode to the heaters, and energize the heaters for a predetermined period to heat the entire plate, before measuring the temperature distribution map. Therefore, there is a problem in that several tens of minutes are required until the temperature distribution map can be measured. As the plate becomes larger, the time required for energizing the heaters to heat the entire plate becomes longer.

It is therefore an object of the present invention to provide a technique for evaluating the position accuracy of heaters with respect to the plate, without executing a process for energizing the heaters to heat the plate.

According to a first aspect of the present invention, there is provided a method for evaluating position accuracy indicating, when members made of a second material are arranged within a disk-shaped first material so as to form a first circle of the second material having a radius of a first length and a second circle of the second material having a radius of a second length, deviation amounts of the first circle and the second circle from designed positions, comprising steps of: (1) substantially equally dividing an outer circumference of the disk-shaped first material into n and measuring a first position to an n-th position; (2) measuring an (n+1)th position, which is an intersection of a first radius connecting the center of the disk-shaped first material and the first position and a circular arc of the first circle, to a 2n-th position, which is an intersection of an n-th radius connecting the center of the disk-shaped first material and the n-th position and the circular arc of the first circle; (3) measuring a (2n+1)th position, which is an intersection of the first radius and a circular arc of the second circle, to a 3n-th position, which is an intersection of the n-th radius and the circular arc of the second circle; (4) calculating a first vector starting from the (n+1)th position and ending at the first position to an n-th vector starting from the 2n-th position and ending at the n-th position; (5) calculating an (n+1)th vector starting from the (2n+1)th position and ending at the (n+1)th position to a 2n-th vector starting from the 3n-th position and ending at the 2n-th position; (6) calculating a first combined vector by adding the first to the n-th vectors; (7) calculating a second combined vector by adding the (n+1)th to the 2n-th vectors; and (8) evaluating the position accuracy of the first and the second circles with respect to the outer circumference of the disk-shaped first material, based on a third combined vector obtained by adding the first combined vector and the second combined vector, wherein "n" is a natural number of four or more.

For the disk-shaped first material, nitride ceramics such as silicon nitride, aluminum nitride, boron nitride, and sialon, and an alumina-silicon carbide composite material are preferably used.

For the second material, refractory metals such as tantalum, tungsten, molybdenum, platinum, rhenium, and hafnium, or alloys thereof are preferably used. Carbon, TiN, and TiC can be used as a conductive material other than the metal.

"Members made of a second material are arranged . . . so as to form a first circle having a radius of a first length" means that the members made of the second material need not be arranged so as to form a "complete" circle. As described later, a part of a circular arc may be missing. Further, "so as to form a circle . . . " means that it is "intended" to form a circle. Generally, even if it is intended to arrange the members made of the second material within the disk-shaped first material so as to form a predetermined circle, it is not easy to arrange the members as designed. The present invention is to evaluate how much the members intended to be arranged as designed actually deviate from the designed positions.

According to a second aspect of the present invention, the members made of the second material are arranged also between the center and the second circle so as to form a third, . . . , and an m-th circle, the members made of the second material are arranged between the second circle and the first circle so as to form an (m+1)th, . . . , and an (m+k)th circle, and differences in a radial length between respective adjacent circles are substantially equal.

For example, if it is assumed that m=4, and k=4, the smallest circle is a third circle, a circle slightly larger than the third circle is a fourth circle, a circle slightly larger than the fourth circle is a fifth circle, a circle slightly larger than the fifth circle is a sixth circle, a circle slightly larger than the sixth circle is the second circle, a circle slightly larger than the second circle is a seventh circle, a circle slightly larger than the seventh circle is an eighth circle, and a circle slightly larger than the eighth circle is the first circle.

When it is assumed that a difference in the radial length between adjacent two circles is Δr, then, the following relations are substantially established:

(radial length of the third circle)+Δr≈(radial length of the fourth circle);

(radial length of the fourth circle)+Δr≈(radial length of the fifth circle);

(radial length of the fifth circle)+Δr≈(radial length of the sixth circle);

(radial length of the sixth circle)+Δr≈(radial length of the second circle);

(radial length of the second circle)+Δr≈(radial length of the seventh circle);

(radial length of the seventh circle)+Δr≈(radial length of the eighth circle); and (radial length of the eighth circle)+Δr≈(radial length of the first circle).

According to a third aspect of the present invention, the radius of the first circle is the longest among the radii of the first, the second, the third, ..., the m-th, the (m+1)th, ..., and the (m+k) th circles, and the radius of the second circle is substantially half the length of the radius of the first circle.

For example, a relation of (radial length of the third circle)<(radial length of the fourth circle)<(radial length of the fifth circle)<(radial length of the sixth circle)<(radial length of the second circle)<(radial length of the seventh circle)<(radial length of the eighth circle)<(radial length of the first circle) is established, and a relation of (radial length of the second circle)≈(radial length of the first circle)/2 is established.

According to the first aspect of the present invention, the position accuracy of the first and the second circle made of the second material with respect to the outer circumference of the disk-shaped first material can be evaluated in a short period of time, based on the third combined vector.

According to the second aspect of the present invention, the combined vector obtained by using the above method agrees well with an eccentric direction obtained from a temperature distribution map, and hence, the position accuracy of the first and the second circle made of the second material with respect to the outer circumference of the first disk-shaped material can be accurately evaluated.

BRIEF DESCRIPTION OF THE DRAWINGS

Exemplary embodiments of the invention will become more fully apparent from the following description and appended claims, taken in conjunction with the accompanying drawings. Understanding that these drawings depict only exemplary embodiments and are, therefore, not to be considered limiting of the invention's scope, the exemplary embodiments of the invention will be described with additional specificity and detail through use of the accompanying drawings in which:

FIGS. 1A, 1B show a schematic configuration of a position accuracy evaluation apparatus, in which

FIG. 6A, 6B show an example of a designed heater element position and an actual heater element position, in which

DETAILED DESCRIPTION OF THE INVENTION

Various embodiments of the invention are now described with reference to the Figures. The embodiments of the present invention, as generally described and illustrated in the Figures herein, could be arranged and designed in a wide variety of different configurations. Thus, the following more detailed description of several exemplary embodiments of the present invention, as represented in the Figures, is not intended to limit the scope of the invention, as claimed, but is merely representative of the embodiments of the invention.

The word "exemplary" is used exclusively herein to mean "serving as an example, instance, or illustration." Any embodiment described herein as "exemplary" is not necessarily to be construed as preferred or advantageous over other embodiments. While the various aspects of the embodiments are presented in drawings, the drawings are not necessarily drawn to scale unless specifically indicated.

<Configuration of Position Accuracy Evaluation Apparatus>

Figure 1A:
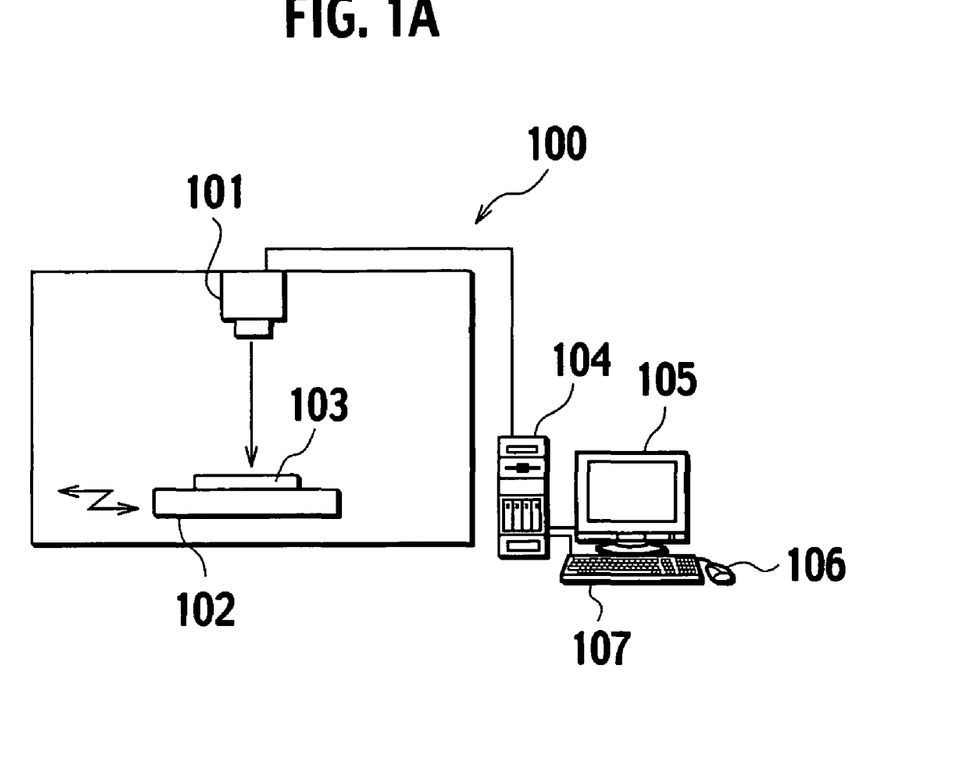
FIG. 1A is an overall block diagram of the position accuracy evaluation apparatus.
Figure 1B:
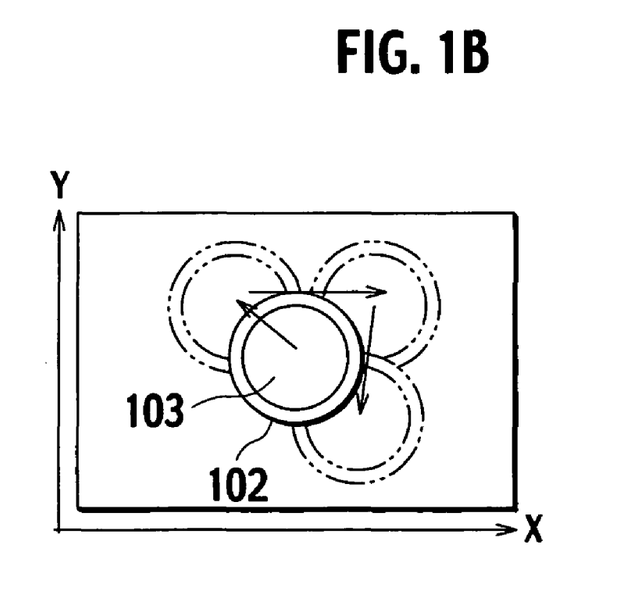
FIG. 1B is a plan view for explaining movement of an XY stage.

FIGS. 1A, 1B show a schematic configuration of a position accuracy evaluation apparatus. FIG. 1A is an overall block diagram of the position accuracy evaluation apparatus, and FIG. 1B is a plan view for explaining movement of an XY stage. As shown in FIGS. 1A and 1B, a position accuracy evaluation apparatus 100 includes an X-ray camera 101, an XY stage 102 movable in X and Y directions with a measurement object (sample) 103 placed thereon, and a personal computer (PC) 104 that controls the X-ray camera 101 and the XY stage 102. The PC 104 includes a display device 105 such as a CRT or a liquid crystal display, a pointing device 106 such as a mouse, a track pad, or a stick pointer, a character/numeric input unit 107 such as a keyboard, a hard disk drive (HDD) (not shown) and a central processing unit (CPU). The HDD is one example of a storage unit that can store measurement object positions of the sample and members therein, and the CPU is one example of a calculating unit that can calculate a vector starting from one of the measurement object positions and ending at the other measurement object position, and also calculate the sum of two or more vectors.

The position accuracy evaluation apparatus 100 also includes an XY stage drive unit (not shown). Even if the X-ray camera 101 cannot observe the entire measurement object 103 by one shot, the entire measurement object 103 can be observed without exception by appropriately moving the XY stage in X and Y directions. For example, even if the observable range by the X-ray camera 101 by one shot is 200 mm in diameter, if the XY stage 102 can move 100 mm in X and Y directions, respectively, a photographable range is 400 mm by dividing photographing to five shots.

Photographing the entire measurement object 103 by a plurality of shots means that the range to be observed by the X-ray camera 101 by one shot becomes narrower as compared to photographing the entire measurement object 103 by one shot, which has a merit in that measurement errors decrease.

<Positioning of Position Accuracy Evaluation Process in Entire Plate Machining>

Figure 2:
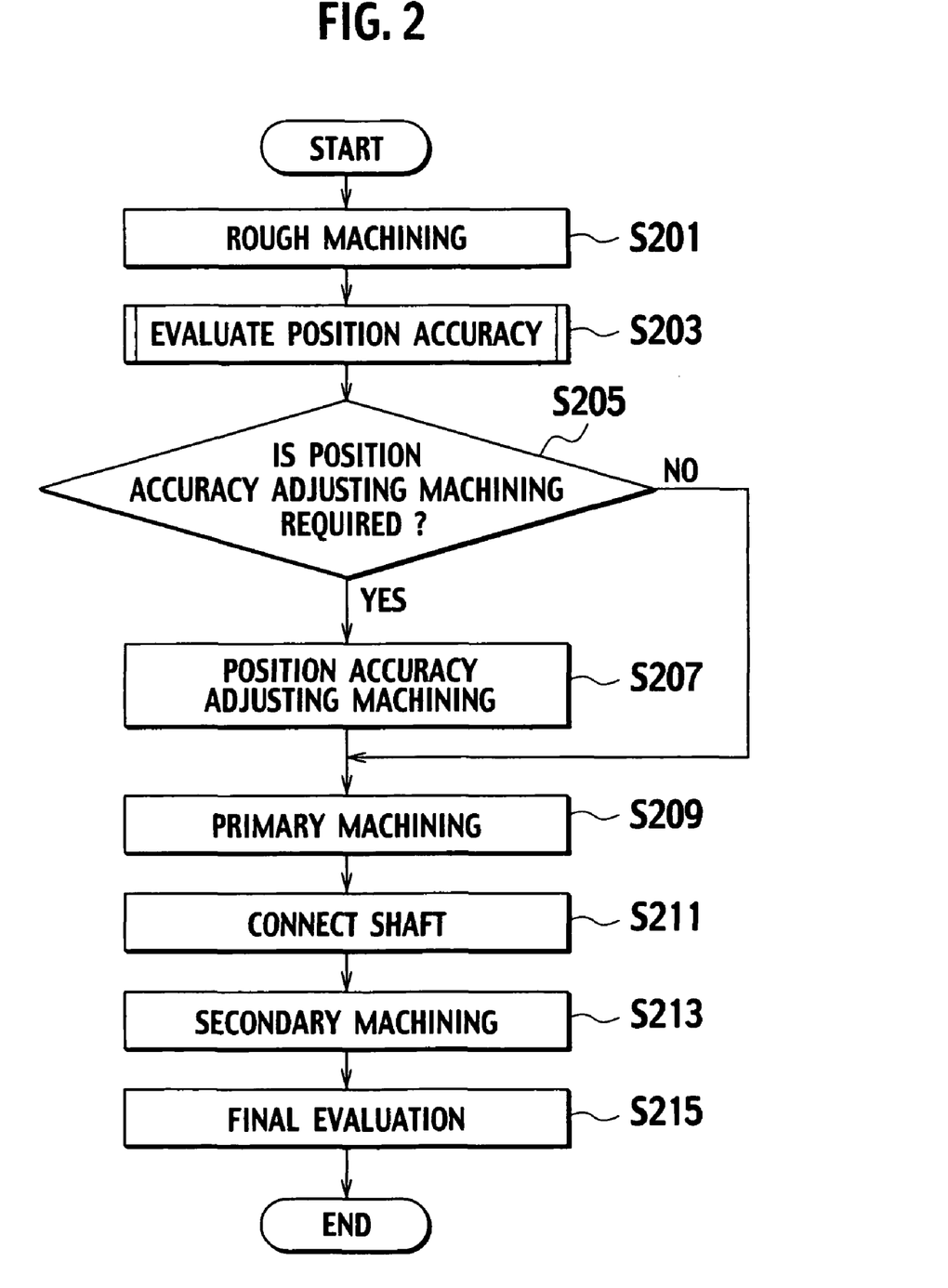
FIG. 2 is a flowchart showing a flow from rough machining of a plate to a final evaluation stage.

FIG. 2 shows a flow from rough machining of the plate to a final evaluation stage. As shown in FIG. 2, an unprocessed plate is roughly machined (step S201), position accuracy is evaluated (step S203), and it is determined whether eccentric machining is required (step S205). When the eccentric machining is required, the eccentric machining is performed (step S207), and then primary machining is performed (step S209). When the eccentric machining is not required, the eccentric machining is omitted and the primary machining is performed (step S209). Thereafter, a shaft is connected to the primary-machined plate (step S211), secondary machining is performed (step S213), and then, final evaluation is performed (step S215).

Thus, position accuracy evaluation (step S203) and determination whether the eccentric machining is required (step S205) in the embodiment are performed between the rough machining of the plate (step S201) and the eccentric machining (step S207). It is determined whether the eccentric machining is required based on the position accuracy evaluation (step S203) (step S205).

For example, it is assumed that a first perimeter heater element, a second perimeter heater element, . . . , and an eighth perimeter heater element are embedded in the plate from the center of the plate toward an outer circumference thereof. In this case, a distance between the outer circumference of the plate and the outermost heater element (the eighth perimeter heater element) is measured at a plurality of points, and a distance between the outermost heater element and the fifth perimeter heater element is measured at a plurality of points. Based on measurement data, the relative position of the outermost heater element with respect to the outer circumference of the plate, and the relative position of the fifth perimeter heater element with respect to the outermost heater element are calculated.

<Flow of Position Accuracy Evaluation>

Figure 3:
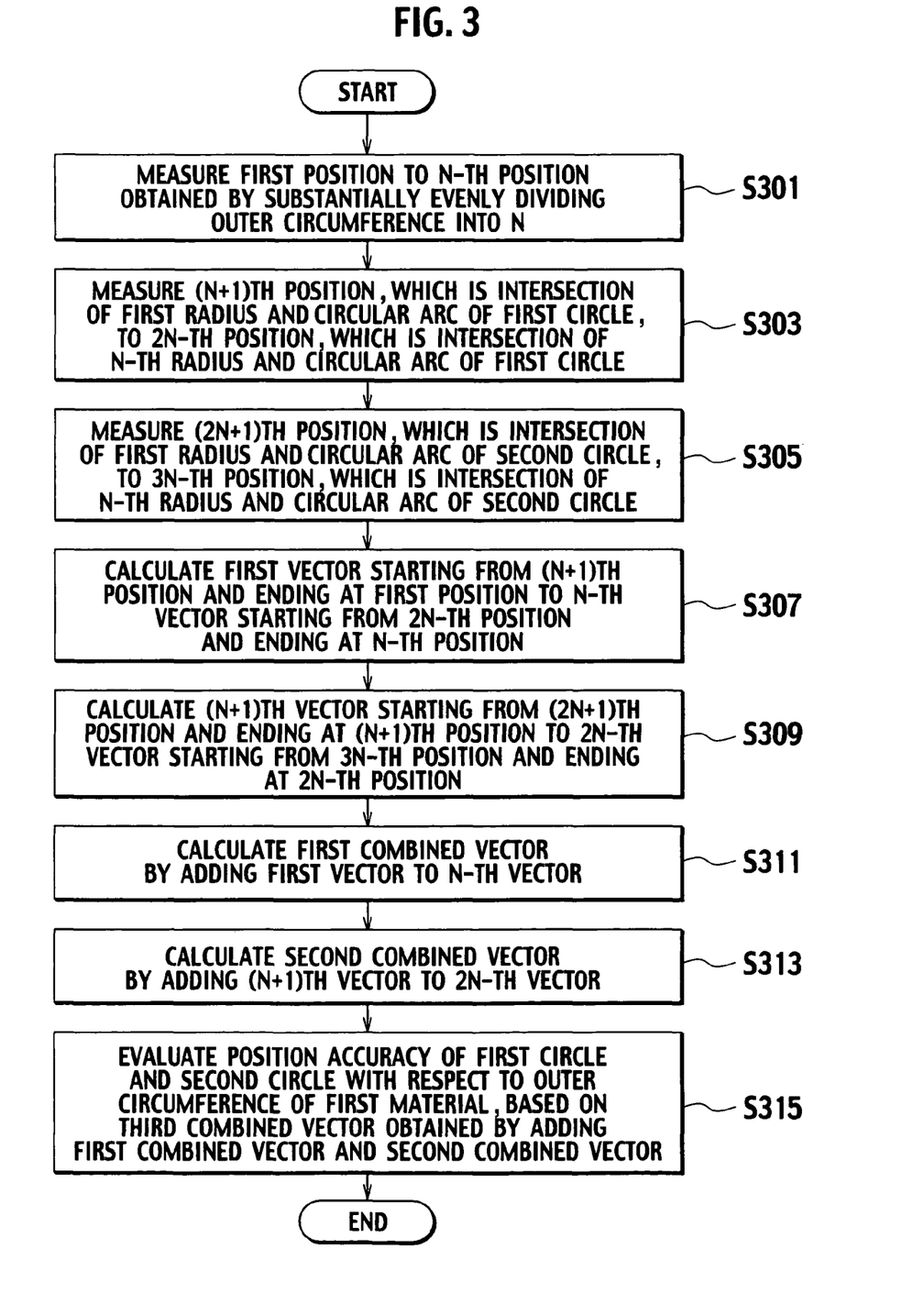
FIG. 3 is a flowchart showing a flow of a position accuracy evaluation.

FIG. 3 is a flowchart showing the flow of the position accuracy evaluation. As shown in FIG. 3, the outer circumstance of the disk-shaped first material is substantially evenly divided into n, and a first position to an n-th position is measured (step S301).

In the embodiment, the disk-shaped first material is a ceramic plate, and the outer circumstance of the plate is divided into twelve, and the first position to the twelfth position is measured.

The (n+1) th position, which is an intersection of the first radius and a circular arc of the first circle, the first radius connecting the center of the disk-shaped first material and the first position, to the 2n-th position, which is an intersection of the n-th radius and the circular arc of the first circle, the n-th radius connecting the center of the disk-shaped first material and the n-th position, is measured next (step S303).

In the embodiment, the first perimeter heater element, the second perimeter heater element, . . . , and the eighth perimeter heater element are formed in the ceramic plate. The first perimeter heater element is the heater element closest to the center of the plate, and the eighth perimeter heater element is the heater element closest to the outer circumference of the plate.

A radius connecting the center of the plate and the first position on the outer circumference of the plate is the first radius;

a radius connecting the center of the plate and the second position on the outer circumference of the plate is the second radius;

a radius connecting the center of the plate and the third position on the outer circumference of the plate is the third radius; . . . ; and a radius connecting the center of the plate and the twelfth position on the outer circumference of the plate is a twelfth radius, that is, n=12.

An intersection of the first radius and the eighth perimeter heater element is the thirteen-th position;

an intersection of the second radius and the eighth perimeter heater element is the fourteen-th position;

an intersection of the third radius and the eighth perimeter heater element is the fifteen-th position; . . . ; and an intersection of the twelfth radius and the eighth perimeter heater element is the twenty-fourth position.

The (2n+1) th position, which is an intersection of the first radius and the circular arc of the second circle, to the 3n-th position, which is an intersection of the n-th radius and the circular arc of the second circle, is measured (step S305).

In the embodiment, the second circle is the fifth perimeter heater element.

An intersection of the first radius and the fifth perimeter heater element is the twenty-fifth position;

an intersection of the second radius and the fifth perimeter heater element is the twenty-sixth position;

an intersection of the third radius and the fifth perimeter heater element is the twenty-seven-th position; . . . ; and an intersection of the twelfth radius and the fifth perimeter heater element is the thirty-sixth position.

The first vector starting from the (n+1)th position and ending at the first position to the n-th vector starting from the 2n-th position and ending at the n-th position is calculated (step S307).

In the embodiment, a vector starting from the thirteen-th position and ending at the first position is the first vector;

a vector starting from the fourteen-th position and ending at the second position is the second vector;

a vector starting from the fifteen-th position and ending at the third position is the third vector; . . . ; and a vector starting from the twenty-fourth position and ending at the twelfth position is the twelfth vector.

The (n+1) th vector starting from the (2n+1)th position and ending at the (n+1)th position to the 2n-th vector starting from the 3n-th position and ending at the 2n-th position is calculated, respectively (step S309).

In the embodiment, a vector starting from the twenty-fifth position and ending at the thirteen-th position is the thirteen-th vector;

a vector starting from the twenty-sixth position and ending at the fourteen-th position is the fourteen-th vector;

a vector starting from the twenty-seven-th position and ending at the fifteen-th position is the fifteen-th vector; . . . ; and a vector starting from the thirty-sixth position and ending at the twenty-fourth position is the twenty-fourth vector.

The first vector to the n-th vector is then added to calculate a first combined vector (step S311).

In the embodiment, all of the first vector, the second vector, the third vector, . . . , and the twelfth vector are added to calculate the first combined vector.

The (n+1) th vector to the 2n-th vector is added to calculate a second combined vector (step S313).

In the embodiment, all of the thirteen-th vector, the fourteen-th vector, the fifteen-th vector, . . . , and the twenty-fourth vector are added to calculate the second combined vector.

Lastly, the second material position accuracy of the first circle and the second circle with respect to the outer circumference of the first material is evaluated based on the third combined vector obtained by adding the first and the second combined vectors (step S315)

<Coordinate Information of Measurement Position>

When respective positions are to be measured, a mark is respectively displayed at the designed positions. The outer circumference of the first material, the circular arc of the first circle of the second material, or the circular arc of the second circle of the second material closest to the mark is designated as an actually measured position.

In an example in which the outer circumference is divided into 12, marks are displayed at positions obtained by dividing the circular arc of a circle having a designed radius into 12, and the outer circumference closest to the marks is designated as the actually measured position. If the ceramic plate has a dimension as designed, all the marks relating to the positions on the outer circumference should be displayed on the outer circumference of the plate photographed by the X-ray camera. Due to various reasons, however, all the marks are not always displayed on the outer circumference. Likewise, if the heaters are embedded at positions as designed, all the marks relating to the positions of the eighth perimeter heater element should be displayed on the eighth perimeter heater element photographed by the X-ray camera. Due to various reasons, however, all the marks are not always displayed on the eighth perimeter heater element. The same applies to the fifth perimeter heater element.

An example of a method for calculating the designed position (hereinafter, appropriately referred to as "design value") will be explained with reference to FIGS. 4 and 5. An example of a state in which the actually measured position deviates from the designed position is shown in FIG. 6A, 6B.

Figure 4:
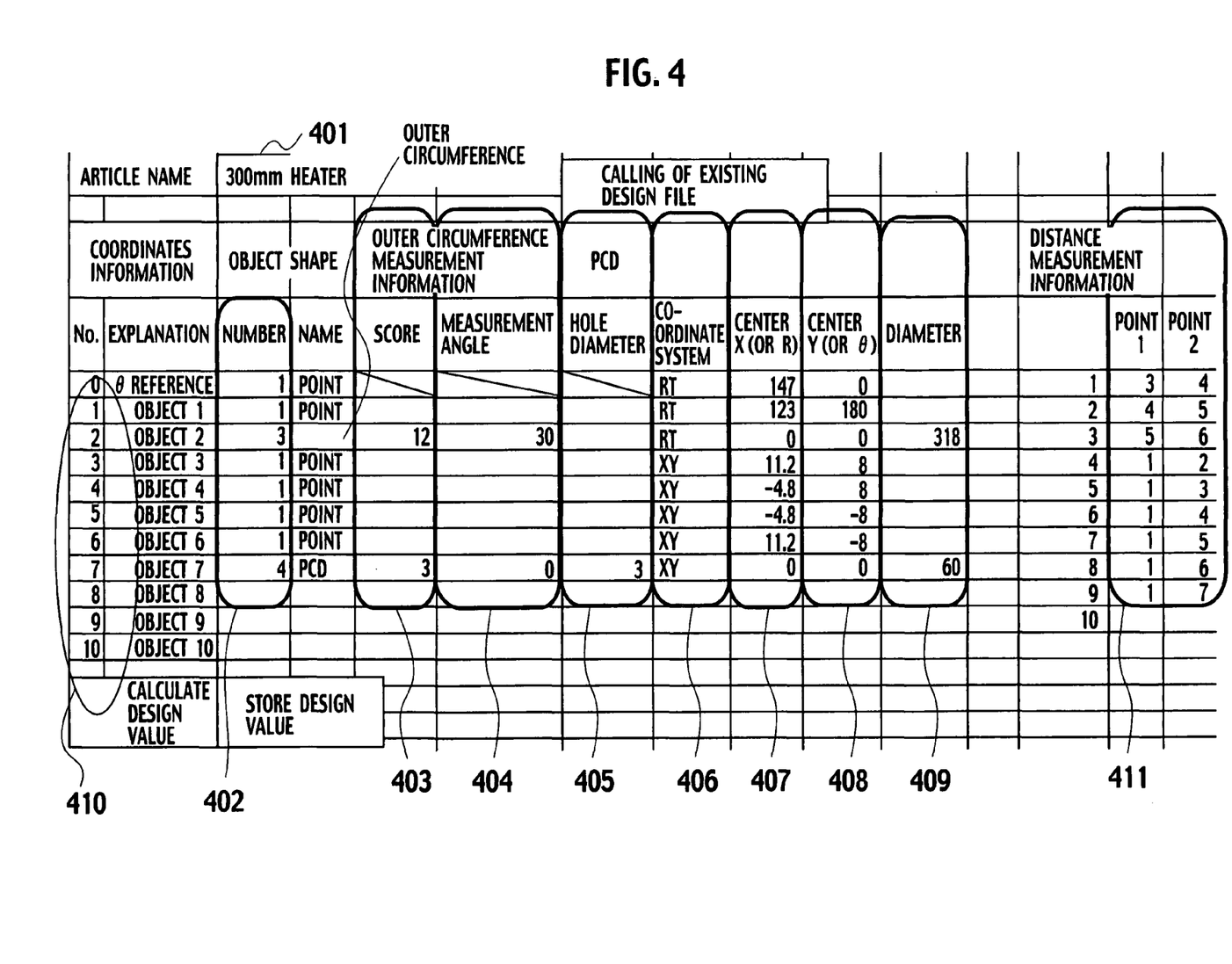
FIG. 4 shows an example of basic information for calculating designed positions.

FIG. 4 shows an example of basic information for calculating the designed position. As shown in FIG. 4, an article name of the measurement object is input in column 401, a number for a measurement object shape in column 402, a score in outer circumference measurement information in column 403, an offset angle in the outer circumference measurement information in column 404, a hole diameter for PCD in column 405, whether the coordinate system is an XY coordinate system or Rθ coordinate system is input in column 406, and in the case of the Rθ coordinate system, radius R, or in the case of the XY coordinate system, X coordinate value is input in column 407, in the case of the Rθ coordinate system, angle θ, or in the case of the XY coordinate system, Y coordinate value is input in column 408, a diameter when the object shape is the outer circumference or PCD is input in column 409, a coordinate number in column 410, and coordinate numbers of two points, a distance of which is to be measured, are input in column 411, respectively.

For example, object shape number "1" indicates that the object shape is "point", object shape number "2" indicates that the object shape is "hole (three point measurement)", object shape number "3" indicates that the object shape is "outer circumference (n-point measurement)", and object shape number "4" indicates that the object shape is "PCD measurement".

When "object shape: name" corresponding to the coordinate number input in the column 411 is "hole" or "outer circumference", a distance between the hole or the outer circumference and the "center" is measured. The "PCD" in the object shape is a pitch circle diameter, and a diameter of a circle connecting central positions of lift pin holes. The "measurement angle" in the outer circumference measurement information is an angle between radial lines connecting the respective measurement points and the center, and "hole diameter" for PCD is a diameter of the lift pin hole.

<Designed Measurement Positions>

Figure 5:
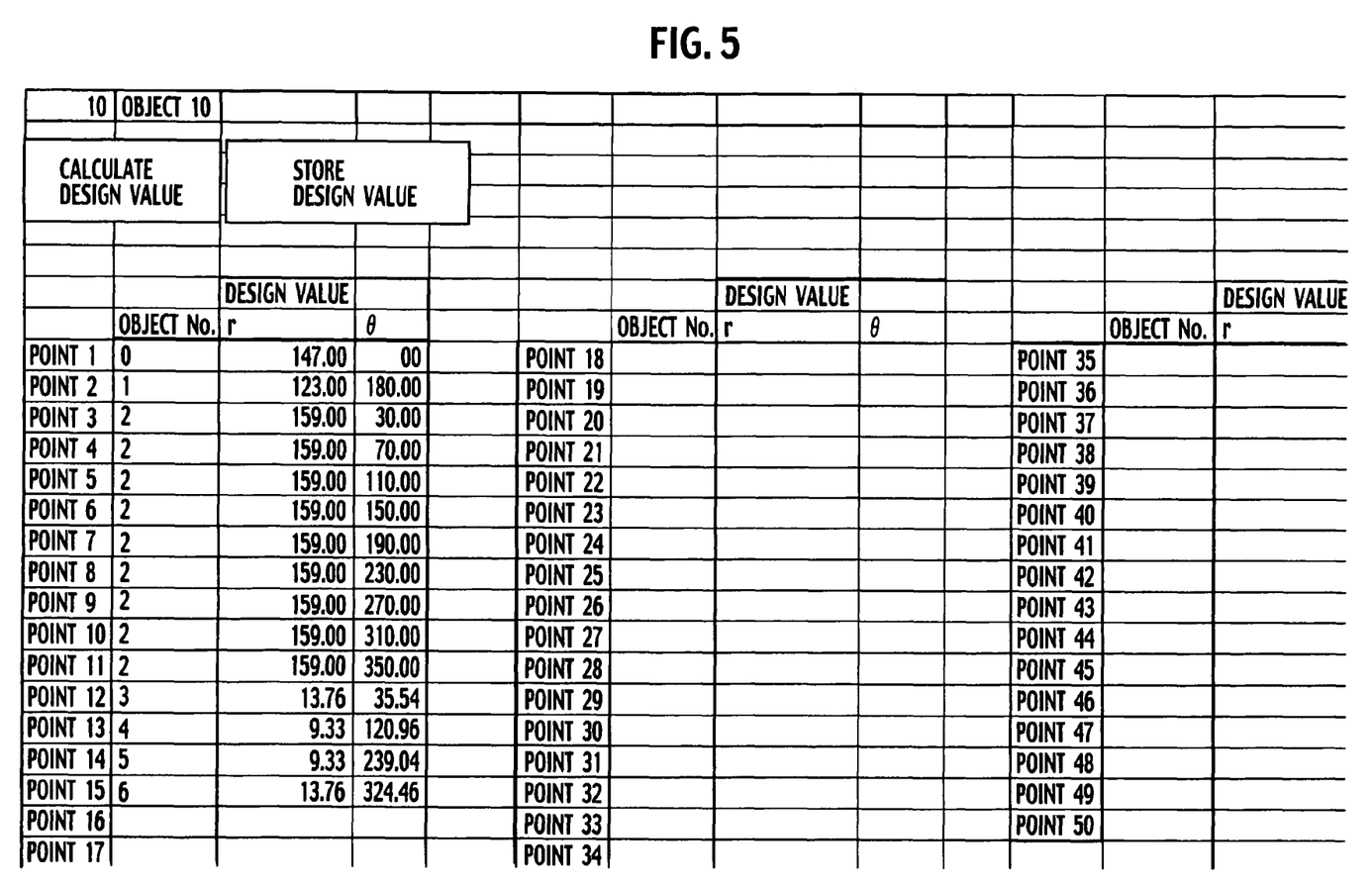
FIG. 5 shows an example of the designed positions.
Figure 6A:
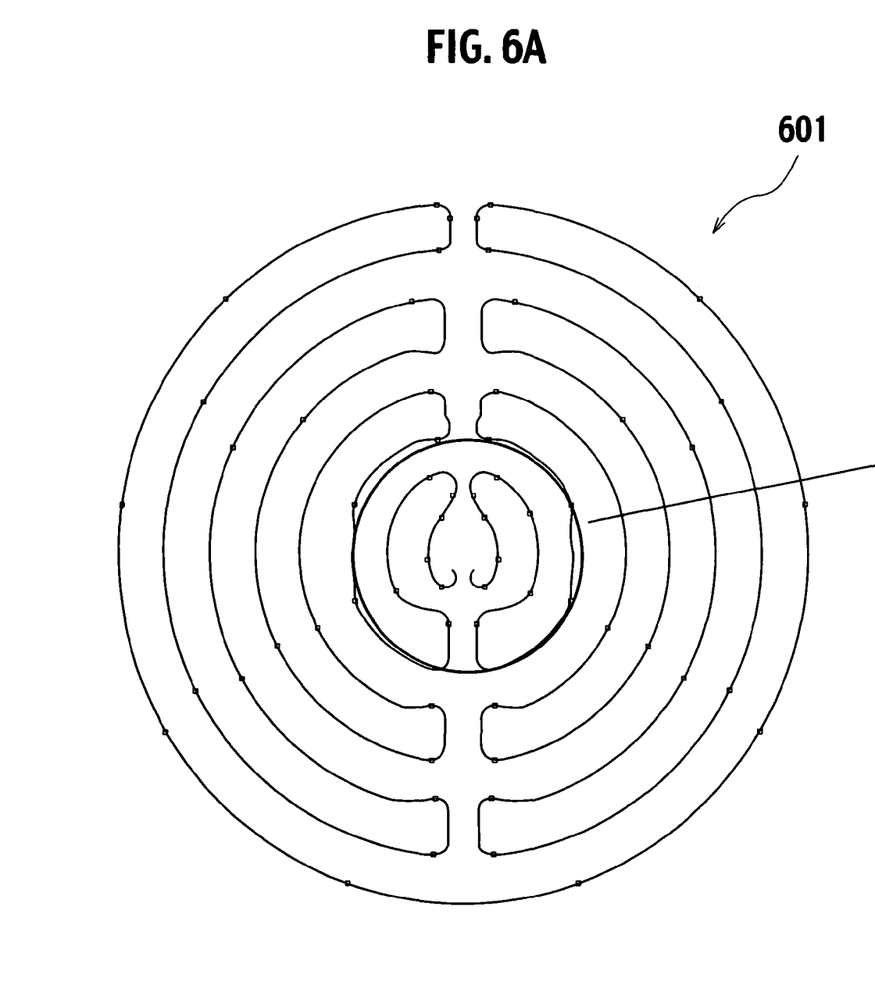
FIG. 6A shows an image of a heater element photographed by an X-ray camera.
Figure 6B:
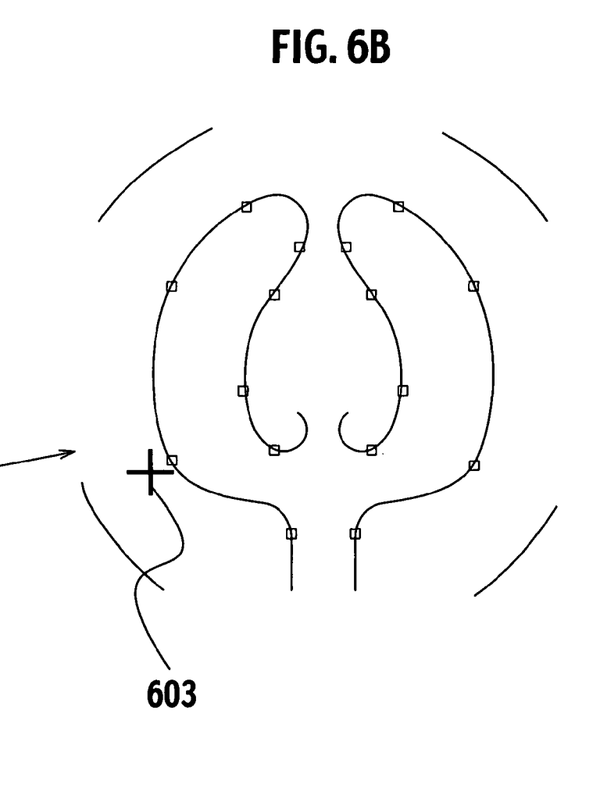
FIG. 6B is an enlarged view of a central part of FIG. 6A.

FIG. 5 shows one example of designed positions. Designed measurement positions (design values) as shown in FIG. 5 are calculated based on the coordinate information shown in FIG. 4. In the example shown in FIG. 5, the design value is expressed by radius r and angle θ.

"Point 2, object number 1" in FIG. 5 corresponds to coordinate information No. 1 in FIG. 4. As shown in FIG. 4, in coordinate information No. 1, as the Rθ coordinate system, radius r=123 [mm] and angle θ=180 degrees are given initially. Therefore, the design value for "Point 2, object number 1" indicates radius r=123.00 [mm] and angle θ=180.00 degrees.

"Point 3, object number 2" to "Point 11, object number 2" in FIG. 5 correspond to coordinate information No. 2 in FIG. 4. As shown in FIG. 4, in coordinate information No. 2, offset angle =30 degrees and diameter=318 [mm] are given as the outer circumference measurement information. Therefore, the design value for "Point 3, object number 2" indicates radius r=159.00 [mm] and angle θ=30.00 degrees. Further, in the coordinate information No. 2, since score=9 is given as the outer circumference measurement information, the interval between "Point 3, object number 2" and "Point 4, object number 2" is 360/9=40 degrees. Accordingly, the design value for "Point 4, object number 2" indicates radius r=159.00 [mm] and angle θ=70.00 degrees.

Likewise, the design value for "Point 5, object number 2" in FIG. 5 indicates radius r=159.00 [mm] and angle θ=110.00 degrees;

"Point 6, object number 2" indicates radius r=159.00 [mm] and angle θ=150.00 degrees;

"Point 7, object number 2" indicates radius r=159.00 [mm] and angle θ=190.00 degrees;

"Point 8, object number 2" indicates radius r=159.00 [mm] and angle θ=230.00 degrees;

"Point 9, object number 2" indicates radius r=159.00 [mm] and angle θ=270.00 degrees;

"Point 10, object number 2" indicates radius r=159.00 [mm] and angle θ=310.00 degrees; and "Point 11, object number 2" indicates radius r=159.00 [mm] and angle θ=350.00 degrees.

"Point 12, object number 3" in FIG. 5 corresponds to coordinate information No. 3 in FIG. 4. As shown in FIG. 4, in coordinate information No. 3, X coordinate value=11.2 [mm] and Y coordinate value=8 [mm] are given as the XY coordinate system. Based on these values, radius r=13.76 [mm] and angle θ=35.54 degrees are calculated as the design value for "Point 12, object number 3" in FIG. 5.

Likewise, based on X coordinate value=−4.8 [mm] and Y coordinate value=8 [mm] in coordinate information No. 4, radius r=9.33 [mm] and angle θ=120.96 degrees are calculated as the design value for "Point 13, object number 4" in FIG. 5.

Based on X coordinate value=−4.8 [mm] and Y coordinate value =−8 [mm] in coordinate information No. 5, radius r=9.33 [mm] and angle θ=239.04 degrees are calculated as the design value for "Point 14, object number 5" in FIG. 5.

Based on X coordinate value=11.2 [mm] and Y coordinate value =−8 [mm] in coordinate information No. 6, radius r=13.76 [mm] and angle θ=324.46 degrees are calculated as the design value for "Point 15, object number 6" in FIG. 5. In this manner, designed heater positions are determined for each article.

<Actual Heater Position>

FIG. 6A, 6B shows an example of a designed heater position (hereinafter, referred to as "heater element position") and an actual heater element position. As shown in FIG. 6A, an image 601 of a heater element photographed by using the X-ray camera 101 is displayed on a display screen of the device 105.

FIG. 6B is an enlarged view of the central part of FIG. 6A. As shown in FIG. 6B, a cursor 603 is displayed at the predetermined designed heater element position in the image of the photographed heater element. As shown in FIG. 6B, the designed heater element position indicated by the cursor 603 may displace from the actual heater element position photographed by the X-ray camera. In this case, the cursor 603 is moved onto the heater element displayed on the display device, by using a pointing device such as a mouse 106. Then the position of the cursor 603 at the time of occurrence of such an event is fetched in the storage unit of the PC 104 as the actual heater element position, by clicking a button on the mouse 106, or pressing an "Enter" key on the keyboard 11. The confirming process of the actual heater element position is repeated for the preset number of coordinates.

The confirming process of the actual heater element position coil position may be automated. For example, a difference between the position according to design information and the actual position can be automatically fetched, by using a heater element position determination image processing function.

<Processing of Measurement Result>

Figure 7:
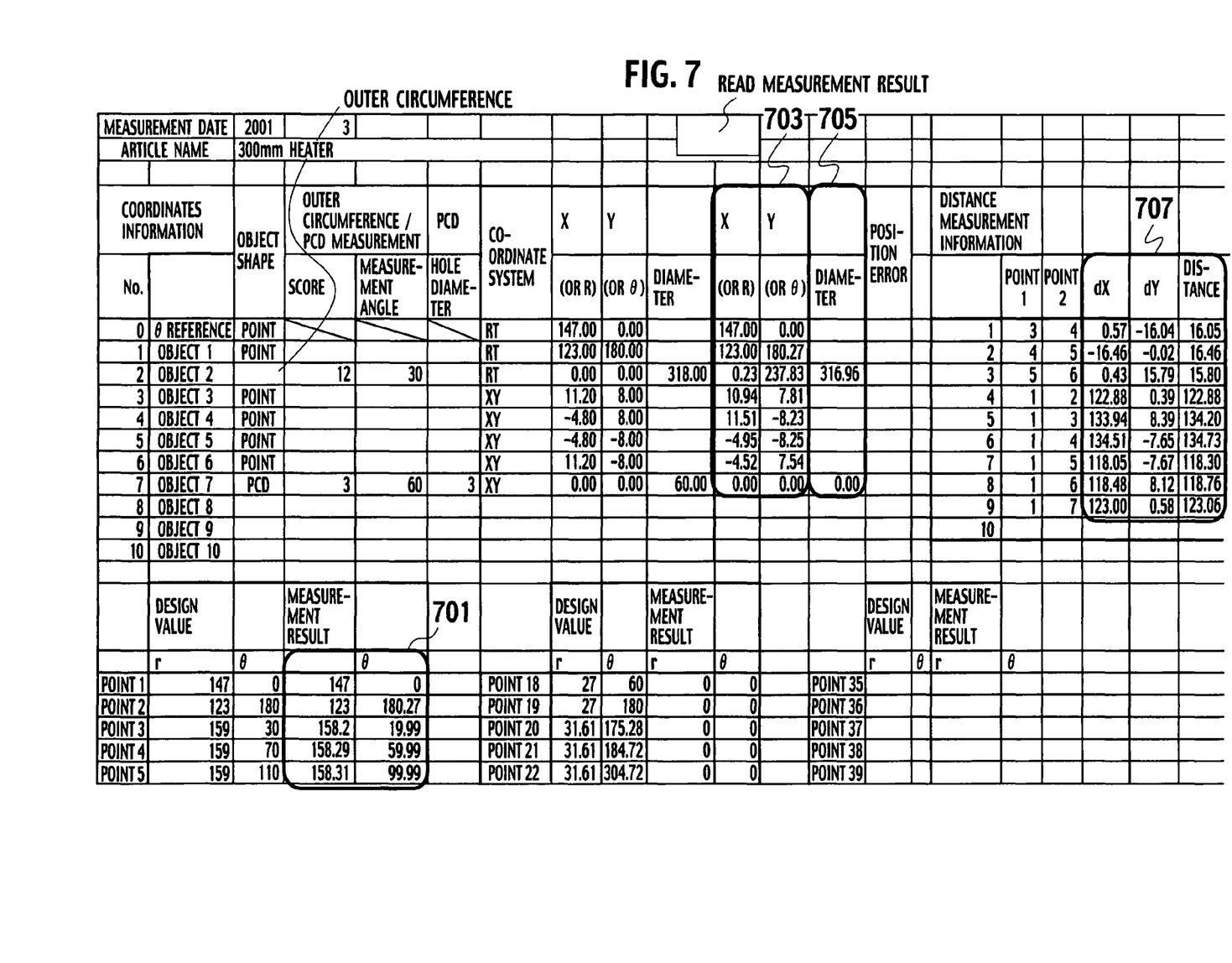
FIG. 7 shows a distance and the like between the actual heater element position (measurement result) and a measurement position calculated from the measurement result.

FIG. 7 shows a distance and the like between the actual heater element position (measurement result) and a measurement position calculated from the measurement result. As shown in FIG. 7, radius r and angle θ obtained from the measurement result are displayed in a display column 701. Specifically, radius r=147 [mm] and angle θ=0 are displayed as a measurement result corresponding to point 1, radius r=123 [mm] and angle θ=180.27 are displayed as a measurement result corresponding to point 2, radius r=158.2 [mm] and angle θ=19.99 are displayed as a measurement result corresponding to point 3, radius r=158.29 [mm] and angle θ=59.99 are displayed as a measurement result corresponding to point 4, and radius r=158.31 [mm] and angle θ=99.99 are displayed as a measurement result corresponding to point 5.

The X coordinate value or the radius r, and the Y coordinate value or the angle θ obtained from the measurement result are displayed in a display column 703. The first line in the display column 703 relates to a reference point at the angle θ, and indicates that the reference point at the angle θ indicates radius R=147.00 mm, and angle θ=0.0 degree.

The second line in the display column 703 relates to a point of coordinate information No. 1, and the measurement result indicates radius r=123.00 mm, and angle θ=180.27 degrees.

The third line in the display column 703 relates to the outer circumference of coordinate information No. 2, and the measurement result indicates radius R=0.20 mm, and angle θ deviates by 237.83 degrees.

The fourth line in the display column 703 relates to a point of coordinate information No. 3, and the measurement result indicates X coordinate value=10.94 [mm] and Y coordinate value=7.81 [mm].

The fifth line in the display column 703 relates to a point of coordinate information No. 4, and the measurement result indicates X coordinate value=11.51 [mm] and Y coordinate value=−8.23 [mm].

The sixth line in the display column 703 relates to a point of coordinate information No. 5, and the measurement result indicates X coordinate value=−4.95 [mm] and Y coordinate value=−8.25 [mm].

The seventh line in the display column 703 relates to a point of coordinate information No. 6, and the measurement result indicates X coordinate value=−4.52 [mm] and Y coordinate value=7.54 [mm].

The eighth line in the display column 703 relates to a point of coordinate information No. 7, and the measurement result indicates X coordinate value=0.00 mm and Y coordinate value=0.00 mm.

A hole diameter, a diameter of the outer circumference, and a PCD diameter are displayed in a display column 705. The "hole diameter" is a diameter of the lift pin hole, the "diameter of the outer circumference" is a diameter in the outermost portion of the heater element, and the "PCD diameter" is a pitch circle diameter connecting central positions of the lift pin holes.

A difference in the X coordinate value between two points, a difference in the Y coordinate value between two points, and a distance between two points are displayed in a display column 707. The first line in the display column 707 relates to point 3 and point 4, indicating X coordinate value of point 3+0.57 [mm]=X coordinate value of point 4, Y coordinate value of point 3−16.04 [mm]=Y coordinate value of point 4, and distance between point 3 and point 4=16.05.

The second line in the display column 707 relates to point 4 and point 5, indicating X coordinate value of point 4−16.46 [mm]=X coordinate value of point 5, Y coordinate value of point 4−0.02 [mm]=Y coordinate value of point 5, and distance between point 4 and point 5=16.46.

The third line in the display column 707 relates to point 5 and point 6, indicating X coordinate value of point 5+0.43 [mm]=X coordinate value of point 6, Y coordinate value of point 5+15.79 [mm]=Y coordinate value of point 6, and distance between point 5 and point 6=15.80.

<Outer Circumference of Plate, Outermost Heater Element, and Fifth Perimeter Heater Element>

Figure 8:
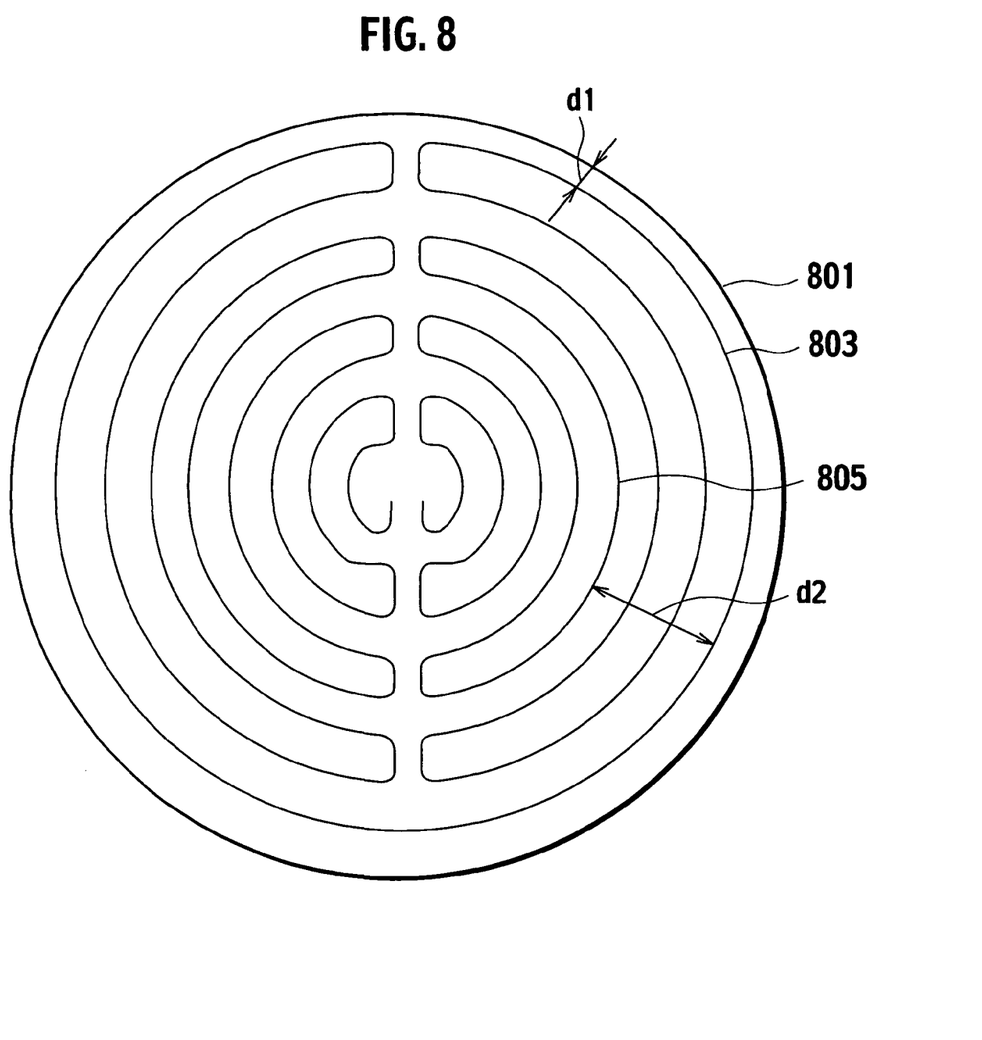
FIG. 8 shows a distance d1 between an outer circumference of the plate and an outermost heater element, and a distance d2 between the outermost heater element and a fifth perimeter heater element.

A distance between the outer circumference of the plate and the outermost heater element, and a distance between the outermost heater element and the fifth perimeter heater element are shown in FIG. 8. As shown in FIG. 8, the distance between the outer circumference of the plate and the outermost heater element stands for a distance d1 between the outer circumference 801 of the plate and the outermost heater element 803. The distance between the outermost heater element and the fifth perimeter heater element stands for a distance d2 between the outermost heater element 803 and the fifth perimeter heater element 805. The distances d1 and d2 are calculated based on the actual measurement values.

<Position Accuracy Analysis of Heater Element>

Figure 9:
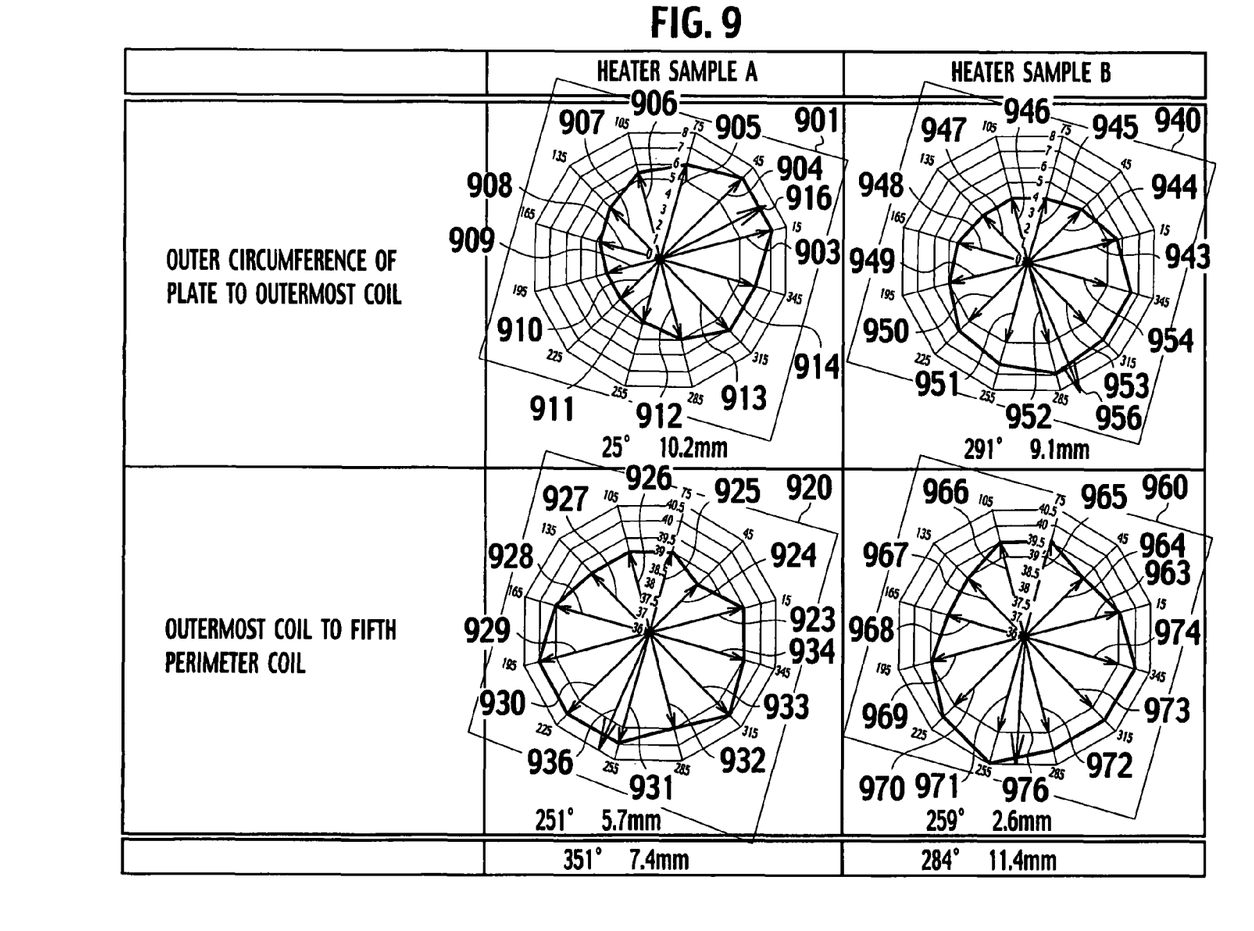
FIG. 9 shows an example of a vector or a combined vector calculated from the actual measurement positions.

FIG. 9 shows one example of a vector or a combined vector calculated from the actual measurement positions. Position accuracy analysis of the heater element is explained with reference to FIG. 9. In the example shown in FIG. 9, a position at an angle of 15 degrees on the outer circumference of the plate is designated as a first position, a position at an angle of 45 degrees is designated as a second position, a position at an angle of 75degrees is designated as a third position, . . . , and a position at an angle of 345 degrees is designated as a twelfth position. Further, the distance d1 between the outer circumference of the plate and the outermost heater element on the outermost heater element is plotted respectively for the angle θ=15 degrees, 45 degrees, 75 degrees, 105 degrees, 135 degrees, 165 degrees, 195 degrees, 225 degrees, 255 degrees, 285 degrees, 315 degrees, and 345 degrees.

Graph 901 indicates the content of Table 1 with regard to article name: heater sample A.

TABLE 1

| ANGLE θ [DEGREES] | POSITION NUMBER ON OUTER CIRCUMFERENCE OF PLATE | POSITION NUMBER ON OUTERMOST HEATED ELEMENT | DISTANCE d1 [mm] |
|---|---|---|---|
| 15 | 1 | 13 | 7.0 |
| 45 | 2 | 14 | 7.0 |
| 75 | 3 | 15 | 6.1 |
| 105 | 4 | 16 | 5.4 |
| 135 | 5 | 17 | 4.2 |
| 165 | 6 | 18 | 4.0 |
| 195 | 7 | 19 | 3.2 |
| 225 | 8 | 20 | 3.0 |
| 255 | 9 | 21 | 4.1 |
| 285 | 10 | 22 | 5.1 |
| 315 | 11 | 23 | 6.2 |
| 345 | 12 | 24 | 6.0 |

A vector 903 starting from the central point in the graph 901 is the first vector starting from the thirteen-th position on the outermost heater element and ending at the first position on the outermost circumference of the plate;

a vector 904 is the second vector starting from the fourteen-th position and ending at the second position;

a vector 905 is the third vector starting from the fifteen-th position and ending at the third position; and a vector 914 is the twelfth vector starting from the twenty-fourth position and ending at the twelfth position.

A vector 916 obtained by combining vectors 903 to 914 corresponds to the first combined vector. The vector 916 has an angle θ of 25 degrees and a length of 10.2 [mm].

A graph 920 indicates the content of Table 2 with regard to article name: heater sample A.

TABLE 2

| ANGLE θ [DEGREES] | POSITION NUMBER ON OUTERMOST HEATER ELEMENT | POSITION NUMBER ON FIFTH PERIMETER HEATER ELEMENT | DISTANCE d2 [mm] |
|---|---|---|---|
| 15 | 13 | 25 | 39.6 |
| 45 | 14 | 26 | 38.5 |
| 75 | 15 | 27 | 39.1 |
| 105 | 16 | 28 | 39.0 |
| 135 | 17 | 29 | 38.9 |
| 165 | 18 | 30 | 38.6 |
| 195 | 19 | 31 | 39.9 |
| 225 | 20 | 32 | 40.0 |
| 255 | 21 | 33 | 40.0 |
| 285 | 22 | 34 | 39.5 |
| 315 | 23 | 35 | 40.0 |
| 345 | 24 | 36 | 38.5 |

A vector 923 starting from the central point in the graph 920 is the thirteen-th vector starting from the twenty-fifth position on the fifth perimeter heater element and ending at the thirteen-th position on the outermost heater element;

a vector 924 is the fourteen-th vector starting from the twenty-sixth position and ending at the fourteen-th position;

a vector 925 is the fifteen-th vector starting from the twenty-seven-th position and ending at the fifteen-th position; . . . ; and a vector 934 is the twenty-fourth vector starting from the thirty-sixth position and ending at the twenty-fourth position.

A vector 936 obtained by combining vectors 923 to 934 corresponds to the second combined vector. The vector 936 has an angle θ of 251 degrees and a length of 5.7 [mm].

The third combined vector obtained by combining the vector 916 and the vector 936 has an angle θ of 351 degrees and a length of 7.4 [mm].

A graph 940 indicates the content of Table 3 with regard to article name: heater sample B.

TABLE 3

| ANGLE θ [DEGREES] | POSITION NUMBER ON OUTER CIRCUMFERENCE OF PLATE | POSITION NUMBER ON OUTERMOST HEATED ELEMENT | DISTANCE d1 [mm] |
|---|---|---|---|
| 15 | 1 | 13 | 5.6 |
| 45 | 2 | 14 | 4.4 |
| 75 | 3 | 15 | 4.0 |
| 105 | 4 | 16 | 4.1 |
| 135 | 5 | 17 | 3.9 |
| 165 | 6 | 18 | 4.7 |
| 195 | 7 | 19 | 4.9 |
| 225 | 8 | 20 | 6.0 |
| 255 | 9 | 21 | 6.1 |
| 285 | 10 | 22 | 7.1 |
| 315 | 11 | 23 | 6.6 |
| 345 | 12 | 24 | 6.3 |

A Vector 943 starting from the central point in the graph 940 is the first vector starting from the thirteen-th position on the outermost heater element and ending at the first position on the outer circumference of the plate;

a vector 944 is the second vector starting from the fourteen-th position and ending at the second position;

a vector 945 is the third vector starting from the fifteen-th position and ending at the third position; . . . ; and a vector 954 is the twelfth vector starting from the twenty-fourth position and ending at the twelfth position.

A vector 956 obtained by combining vectors 943 to 954 corresponds to the first combined vector. The vector 956 has an angle θ of 291 degrees and a length of 9.1 [mm].

A graph 960 indicates the content of Table 4 with regard to article name: heater sample B.

TABLE 4

| ANGLE θ [DEGREES] | POSITION NUMBER ON OUTERMOST HEATER ELEMENT | POSITION NUMBER ON FIFTH PERIMETER HEATER ELEMENT | DISTANCE d2 [mm] |
|---|---|---|---|
| 15 | 13 | 25 | 39.5 |
| 45 | 14 | 26 | 39.0 |
| 75 | 15 | 27 | 39.6 |
| 105 | 16 | 28 | 39.5 |
| 135 | 17 | 29 | 39.0 |
| 165 | 18 | 30 | 38.9 |
| 195 | 19 | 31 | 39.6 |
| 225 | 20 | 32 | 40.0 |
| 255 | 21 | 33 | 40.5 |
| 285 | 22 | 34 | 40.1 |
| 315 | 23 | 35 | 40.0 |
| 345 | 24 | 36 | 39.9 |

A vector 963 starting from the central point in the graph 960 is the thirteen-th vector starting from the twenty-fifth position on the fifth perimeter heater element and ending at the thirteen-th position on the outermost heater element;

a vector 964 is the fourteen-th vector starting from the twenty-sixth position and ending at the fourteen-th position;

a vector 965 is the fifteen-th vector starting from the twenty-seven-th position and ending at the fifteen-th position; . . . ; and a vector 974 is the twenty-fourth vector starting from the thirty-sixth position and ending at the twenty-fourth position.

A vector 976 obtained by combining vectors 963 to 974 corresponds to the second combined vector. The vector 976 has an angle θ of 259 degrees and a length of 2.6 [mm].

The third combined vector obtained by combining the vector 916 and the vector 936 has an angle θ of 284 degrees and a length of 11.4 [mm].

<Position Accuracy Evaluation by Conventional Method>

Figure 10:
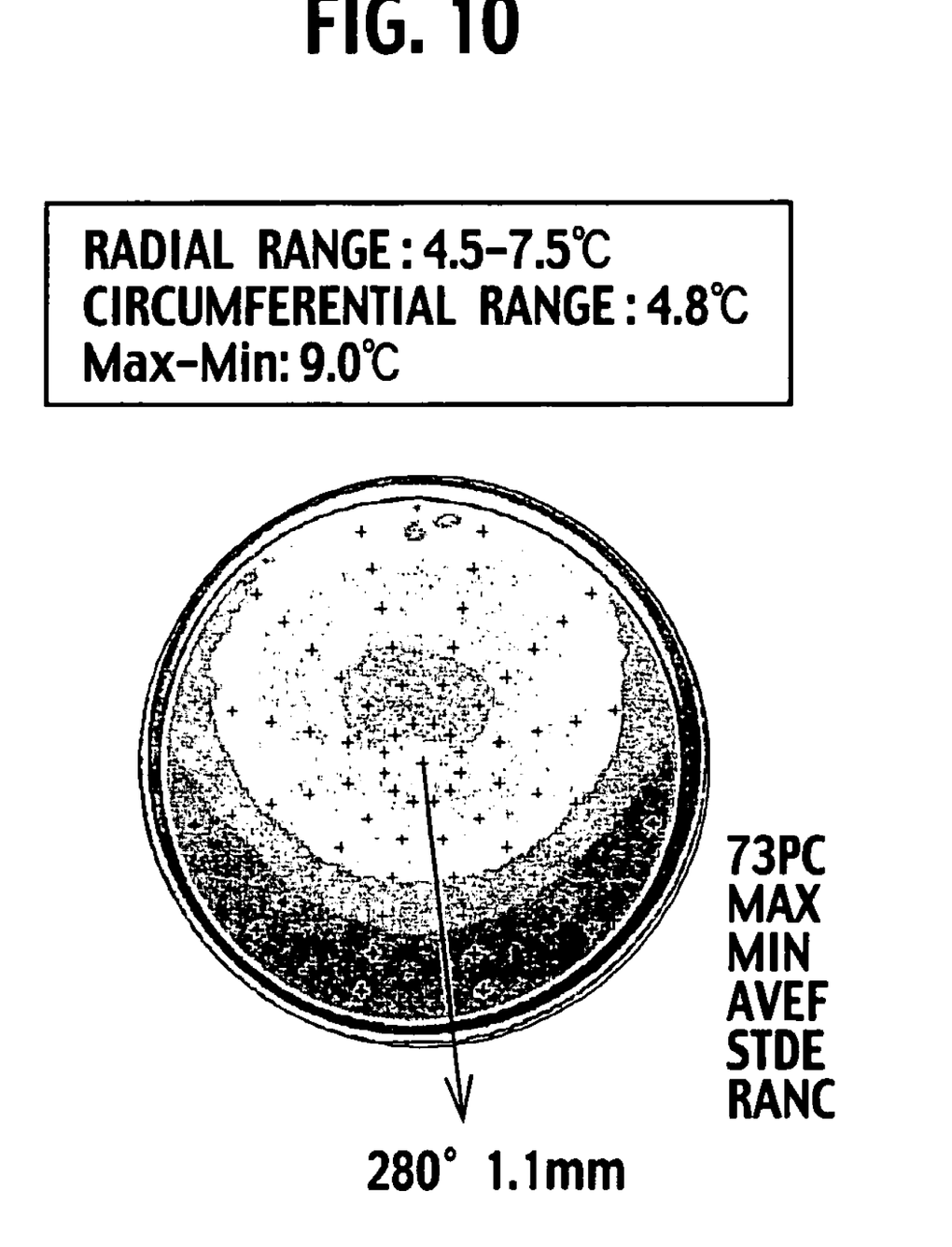
FIG. 10 shows a result of a conventional method for evaluating the temperature distribution using an infrared thermometer.

On the other hand, FIG. 10 shows a result of a conventional method for evaluating the temperature distribution using an infrared thermometer, by energizing the heater elements to heat the entire plate with respect to an article name: HC46302-00089, for which various vectors are shown in graphs 940 and 960 in FIG. 9.

As shown in FIG. 10, a radial range is 4.5 to 7.5° C., the maximum value of a temperature difference on the same circumference is 4.8° C., and the maximum value of a temperature difference on the plate is 9.0° C. A vector 1001 has an angle θ of 280 degrees and a length of 1.1 [mm].

The radial range stands for the maximum value when a plurality of temperature differences are obtained on the same radial. A method for obtaining the angle and the length of the vector 1001 is such that an angle for changing the obtained temperature distribution to symmetrical distribution is obtained by multivariate analysis based on the obtained temperature distribution. As for the length, the maximum temperature difference on the same radial on the outer circumference of the obtained temperature distribution map is first obtained, and an eccentricity required for modifying a 1° C. of temperature difference stored in a database is multiplied to the maximum temperature difference, giving the length.

<Comparison Between Method According to Embodiment and Conventional Method>

The third combined vector obtained by the method according to the embodiment has the angle θ of 284 degrees and the length of 11.4 [mm]. Since an eccentricity conversion rate of the combined vector value is 10%, the eccentricity after conversion becomes 1.14 [mm].

On the other hand, the vector 1001 obtained by the conventional method has the angle θ of 280 degrees and the length of 1.1 [mm]. That is, an equivalent result to that obtained by the conventional method can be obtained by the method according to the embodiment with regard to the eccentricity and the eccentric direction.

Thus, the eccentricity and the eccentric direction with the accuracy equal to the conventional method can be obtained by the method according to the embodiment. The method according to the embodiment does not require energizing the heater elements to heat up the entire plate. Accordingly, there is an effect that the method according to the embodiment can perform process to get the eccentricity and the eccentric direction in a shorter period of time than that required in the conventional method.

What is claimed is:

1. A method for evaluating position accuracy by running a computer program on a computer indicating, when members made of a second material are arranged within a disk-shaped first material so as to form a first circle of the second material having a radius of a first length and a second circle of the second material having a radius of a second length, deviation amounts of the first circle and the second circle from designed positions, comprising steps of:

substantially equally dividing an outer circumference of the disk-shaped first material into n and measuring a first position to an n-th position;

measuring an (n+1)th position, which is an intersection of a first radius and a circular arc of the first circle, the first radius connecting the center of the disk-shaped first material and the first position, to a 2n-th position, which is an intersection of an n-th radius and the circular arc of the first circle, the n-th radius connecting the center of the disk-shaped first material and the n-th position;

measuring a (2n+1)th position, which is an intersection of the first radius and a circular arc of the second circle, to a 3n-th position, which is an intersection of the n-th radius and the circular arc of the second circle;

calculating a first vector starting from the (n+1)th position and ending at the first position to an n-th vector starting from the 2n-th position and ending at the n-th position;

calculating an (n+1)th vector starting from the (2n+1)th position and ending at the (n+1)th position to a 2n-th vector starting from the 3n-th position and ending at the 2n-th position;

calculating a first combined vector by adding the first to the n-th vectors;

calculating a second combined vector by adding the (n+1)th to the 2n-th vectors; and evaluating the position accuracy of the first and the second circles with respect to the outer circumference of the disk-shaped first material, based on a third combined vector obtained by adding the first combined vector and the second combined vector, wherein n is a natural number of at least four.

2. The method for evaluating position accuracy according to claim 1, wherein the members made of the second material are also arranged between the first circle and the second circle, so as to form a third, . . . , and an m-th circle, the members made of the second material are also arranged between the second circle and the center of the disk-shaped first material, so as to form an (m+1)th, . . . , and an (m+k)th circle, and differences in a radial length between adjacent circles are substantially equal.

3. The method for evaluating position accuracy according to claim 2, wherein the radius of the first circle is the longest among the radii of the first, the second, the third, . . . , the m-th, the (m+1)th, . . . , and the (m+k)th circles, and the radius of the second circle is substantially half the length of the radius of the first circle.

4. A position accuracy evaluation apparatus comprising:

an XY stage;

an XY stage drive unit that moves the XY stage in an X or Y direction;

a camera that is arranged above the XY stage and that can photograph an outer circumference of a sample formed of a disk-shaped first material placed on the XY stage, and a first circle having a radius of a first length and a second circle having a radius of a second length, which are members made of a second material and are embedded in the sample;

a storage unit that can store measurement object positions of the sample and the members;

a calculation unit that can calculate a vector starting from one of the measurement object positions and ending at the other measurement object position, and the sum of two or more vectors; and a controller that controls the XY stage drive unit, the camera, the storage unit, and the calculation unit, wherein the controller controls such that the XY stage drive unit moves the XY stage so that portions to be photographed of the sample and the members are within a photographable range of the camera, the camera measures:

a first position to an n-th position on the outer circumference of the disk-shaped first material, obtained by substantially equally dividing the outer circumference into n;

an (n+1)th position, which is an intersection of a first radius and a circular arc of the first circle, the first radius connecting the center of the disk-shaped first material and the first position, to a 2n-th position, which is an intersection of an n-th radius and the circular arc of the first circle, the n-th radius connecting the center of the disk-shaped first material and the n-th position; and a (2n+1)th position, which is an intersection of the first radius and a circular arc of the second circle, to a 3n-th position, which is an intersection of the n-th radius and the circular arc of the second circle, the storage unit stores the first position to the 3n-th position, and the calculation unit calculates:

a first vector starting from the (n+1)th position and ending at the first position to an n-th vector starting from the 2n-th position and ending at the n-th position;

an (n+1)th vector starting from the (2n+1)th position and ending at the (n+1)th position to a 2n-th vector starting from the 3n-th position and ending at the 2n-th position;

a first combined vector by adding the first to the n-th vectors;

a second combined vector by adding the (n+1)th to the 2n-th vectors; and a third combined vector by adding the first combined vector and the second combined vector, so that the position accuracy of the first and the second circles of the second material with respect to the outer circumference of the disk-shaped first material is evaluated based on the third combined vector, wherein n is a natural number of at least four.

* * * * *